United States Patent
Lai et al.

(10) Patent No.: US 6,649,461 B1
(45) Date of Patent: Nov. 18, 2003

(54) METHOD OF ANGLE IMPLANT TO IMPROVE TRANSISTOR REVERSE NARROW WIDTH EFFECT

(75) Inventors: Tommy Mau Lam Lai, Singapore (SG); Weining Li, Singapore (SG); Yung Tao Lin, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/132,356

(22) Filed: Apr. 25, 2002

(51) Int. Cl.[7] .......................... H01L 21/8238
(52) U.S. Cl. ............... 438/217; 438/218; 438/223; 438/296; 438/302
(58) Field of Search ................ 438/195, 196, 438/217, 218, 223, 290, 296, 298, 301, 302, 424, 433, 450, 514

(56) References Cited

U.S. PATENT DOCUMENTS

| | | | |
|---|---|---|---|
| 5,240,874 A | 8/1993 | Roberts | 437/69 |
| 6,083,795 A | 7/2000 | Liang et al. | 438/289 |
| 6,121,096 A | 9/2000 | Hopper | 438/290 |
| 6,426,258 B1 * | 7/2002 | Harada et al. | 438/268 |
| 6,492,220 B2 * | 12/2002 | Ikeda | 438/221 |

* cited by examiner

Primary Examiner—Kamand Cuneo
Assistant Examiner—Asok Kumar Sarkar
(74) Attorney, Agent, or Firm—George O. Saile; Rosemary L. S. Pike

(57) ABSTRACT

A new angle implant is provided that reduces or eliminates the effects of narrow channel impurity diffusion to surrounding regions of insulation. The invention provides for angle implantation of p-type impurities into corners of STI regions that are adjacent to NMOS devices and angle implantation of n-type impurities into corners of STI regions that are adjacent to PMOS devices.

21 Claims, 4 Drawing Sheets

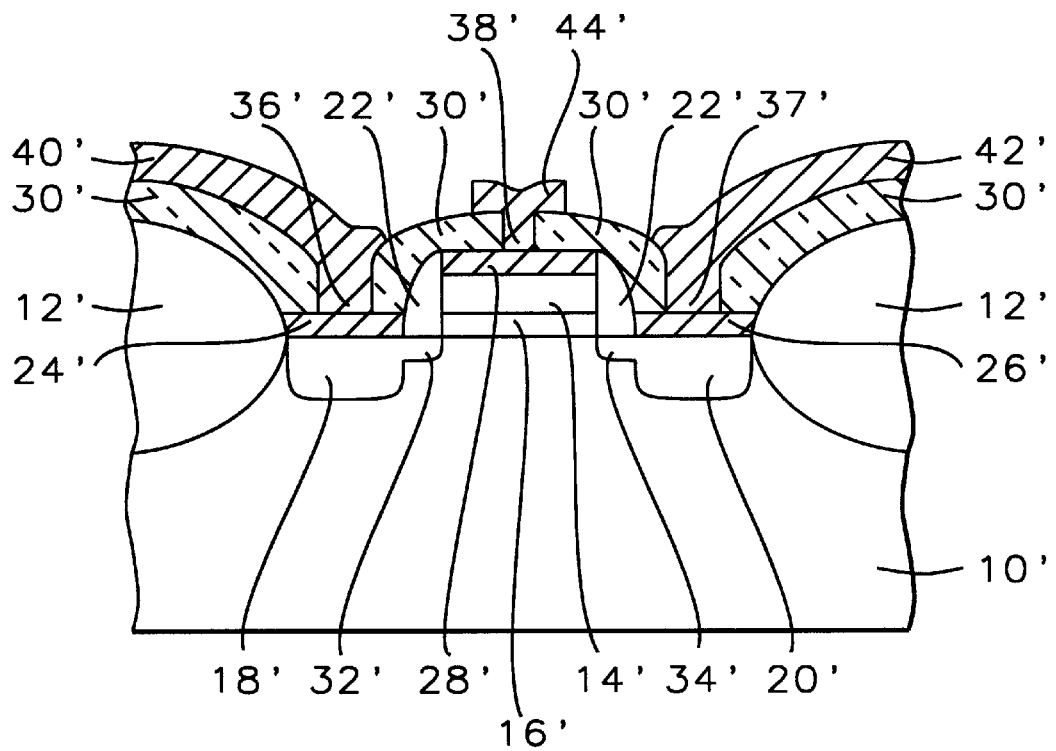
FIG. 1a – Prior Art
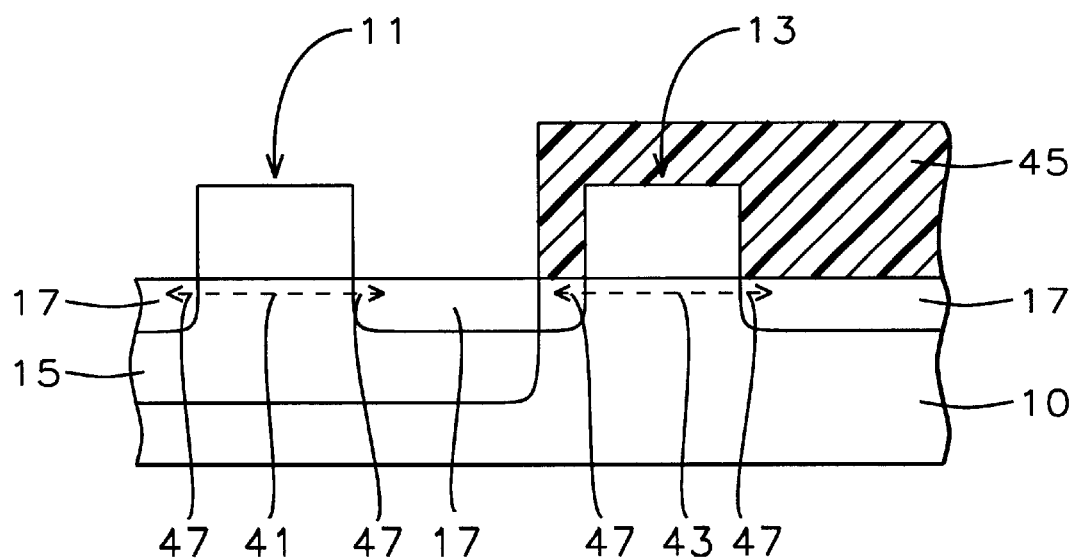
FIG. 1b – Prior Art

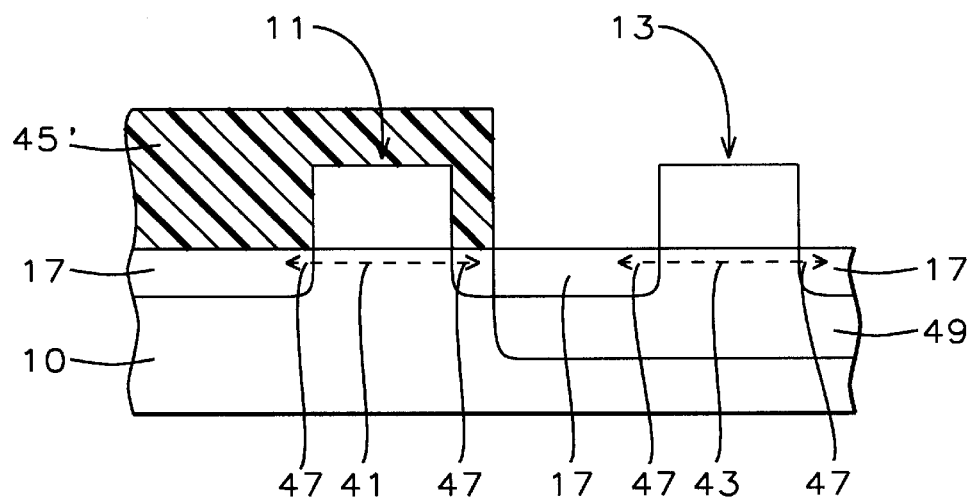
FIG. 1c – Prior Art
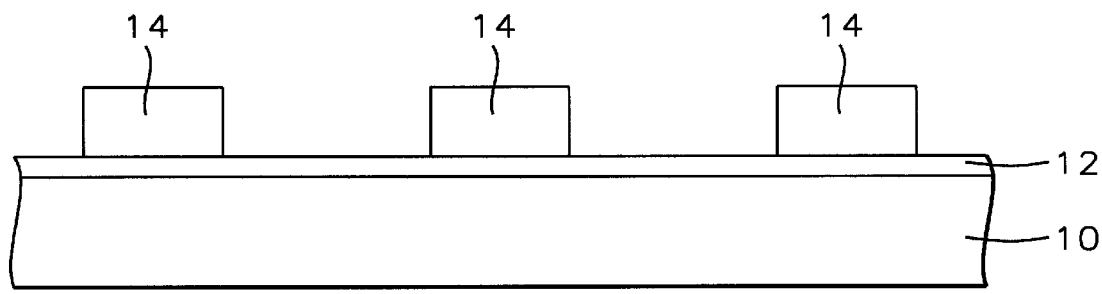
FIG. 2
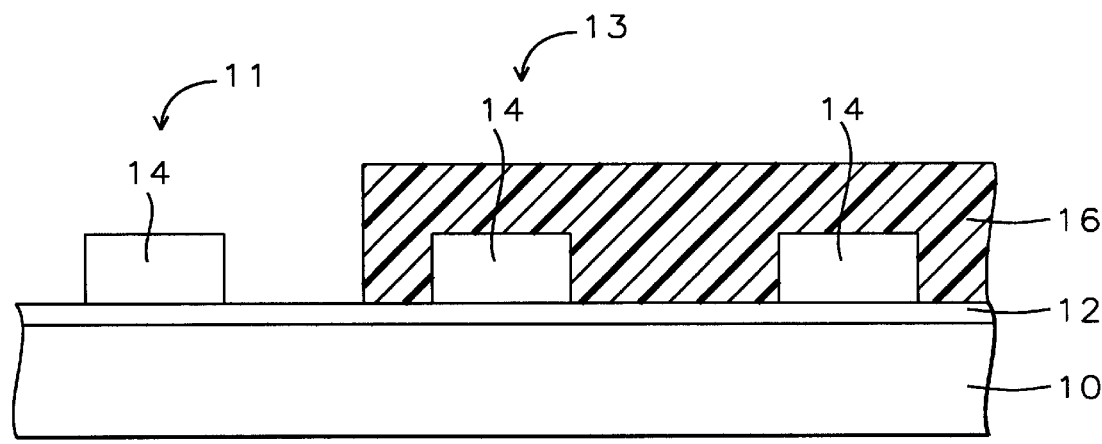
FIG. 3

METHOD OF ANGLE IMPLANT TO IMPROVE TRANSISTOR REVERSE NARROW WIDTH EFFECT

BACKGROUND OF THE INVENTION

(1) Field of the Invention

The invention relates to the fabrication of integrated circuit devices, and more particularly, to a method of reducing dopant-out diffusion occurring in channel regions of PMOS/NMOS gate electrodes having a channel width of 0.25 µm or less.

(2) Description of the Prior Art

With the continued advancement of the semiconductor technology and the fabrication of Integrated Circuit (IC) devices, the components and component features that are part of these devices continue to decrease in dimension. Semiconductor devices can essentially be broken down into bipolar devices and Metal Oxide Semiconductor Field Effect Transistor (MOSFET) devices, whereby the latter category forms an increasing percentage of the total number of devices that are used in Integrated Circuit (IC) applications. It is projected that MOSFET devices will constitute roughly 90% of the overall market whereas the bipolar devices will be used for the remaining 10% of the applications. With reductions in device size is required a reduction in device power consumption, which imposes the requirement of decreased device feature lengths. It can be stated as a general rule that device speed varies inversely proportional with device feature length while power consumption increases approximately with the square of the device feature length. Feature size currently being approached is in the micron and sub-micron or 0.5 µm range where it is not considered impossible that the feature size of 0.2 µm will become a reality in the near future.

Field Effect Transistors (FET) are at this time used extensively in Ultra Large Scale Integration (ULSI) applications. FET are formed using gate electrodes, usually made of polysilicon, and adjacent source/drain regions to which self-aligned source/drain contact areas are established. In its basic form, a Metal Oxide Semiconductor (MOS) transistor has a gate electrode to which a voltage is applied. The gate is created on the surface of a silicon substrate; the voltage that is applied to the gate creates an electric field that is perpendicular to the interface between the gate electrode and the substrate. The areas in the substrate immediately adjacent to the gate electrode are doped, thereby varying their electric conductivity. These areas become the source and drain regions. By varying the voltage that is applied to the gate electrode, the electric field in the interface between the gate and the substrate interface can be varied and, with that, the current that flows between the source and the drain regions. This electric field controls the flow of current through the device, the device is therefore referred to as the Field Effect Transistor.

The type of device that is created and the type of areas that are created in conjunction with the device are to a large extent determined by the type of dopant that is used and the processing conditions under which the dopants are applied. The creation of semiconductor devices starts with a substrate, which is any material that can retain dopant ions, and the isolated conductivity regions brought about by those ions. Typically, a substrate is a silicon-based material, which receives p-type or n-type ions. The device features that are created dictate the type of doping and doping conditions. For instance, boron or phosphorous can be used as a dopant and can be doped into polysilicon layers or into polycide gate electrodes.

Channel stop dopants can be p-type or n-type; implants can contain a p-type dopant such as boron implanted at a dose of $5 \times 10^{13}$ atoms/cm$^2$ at an energy of 35 keV. An n-type dopant is $P_{31}$ implanted at a dose in the order of $2.8 \times 10^{12}$ atoms/cm$^2$ at energy of 60 keV.

A typical conductivity imparting dopant, used to create a lightly doped source and drain region, is phosphorous, ion implanted at an energy between about 5 to 100 KeV, at a dose between about 1E11 to 1E14 atoms/cm$^2$. A medium doped source and drain region can be created by using arsenic or phosphorous, ion implanted at an energy between about 5 to 50 KeV, at a dose between about 1E12 to 5E14 atoms/cm$^2$. A heavily doped source and drain region can be created by using arsenic, ion implanted at an energy between about 5 to 150 KeV, at a dose between about 1E15 to 1E16 atoms/cm$^2$.

Dual gate transistor design is the design where both NMOS and PMOS devices are created on the same chip. Earlier designs of Metal Oxide Semiconductor (MOS) devices primarily used PMOS devices. In its early history, the CMOS transistor was considered to be only an extension of the design for MOS IC's.

Later advancements in fabrication technology, mostly due to improvements in ion implant techniques, allowed for the PMOS devices to be replaced with NMOS devices. The larger drive current of NMOS devices resulted in faster speed of these devices, which resulted in NMOS devices becoming the dominant device type in the IC industry.

NMOS devices however exhibited severe limitations in power density and power dissipation, causing CMOS devices to become the dominant technology for IC device manufacturing. With the arrival of CMOS devices, a renewed interest in PMOS devices developed.

CMOS employs both NMOS and PMOS devices to form logic elements. The advantage of CMOS is that its logic devices draw significant current only during the transition from one logic state to the other while drawing very little current between this transition.

The scaling of the CMOS devices in the sub-micrometer device range presents a major challenge. For the fabrication of p-channel and n-channel devices, n$^+$doped polysilicon gates are used resulting in functional asymmetry. A number of techniques have been used to assure that the p-channel and n-channel devices are completely symmetrical in their performance characteristics such as threshold voltages, device dimensions and doping while the p-channel device is, for ease of manufacturing, a surface channel device. These devices are made using undoped polysilicon for the gate structures that are simultaneously doped at the time that the source/drain regions of each type of device are implanted. This leads to special manufacturing problems caused by, among others, diffusion of impurity implants through the gate oxide into the channel region thereby changing the threshold voltage of the device. Another concern in creating dual-gate CMOS devices is that various dopants may inter-diffuse between adjacent regions, an effect that can become critical at high anneal and other processing temperatures.

Increased CMOS device speed however requires short channel length, the design of p-channel devices with short channel length presents unique problems mostly centered on methods of doping and pocket implants for the device and the impact that these methods have on PMOS device characteristics. A technique used for instance to create deeper and narrower implants is to increase implant energy and implant dosage. This approach however may negate the self-alignment aspect of the implants where the gate electrode serves as a shield and the implants become in this way aligned around the gate electrode. The high implant energy and dosage may result in implant penetration through the gate electrode thereby affecting the gate threshold voltage performance while the high implant energy and dosage may affect the thin layer of gate oxide underlying the gate electrode. It is therefore critical to design an implant method and sequence where gate penetration by implant dopants is not a factor.

Various types of implants are used in the industry to create semiconductor devices. Implants can be a well implant that provides a more uniform background doping. A punch-through implant provides a channel with greater robustness to punch-through voltage. A thresh-hold implant sets the thresh-hold voltage of a device (like an IGFET). The well implant can be provided by boron at a dose in the range of $1 \times 10^{12}$ to $1 \times 10^{13}$ atoms/cm$^2$ and an energy in the range of 100 to 170 kilo-electron volts, a punch-through implant can be provided by boron at an dose in the range of $1 \times 10^2$ to $1 \times 10^{13}$ atoms/cm$^2$ and an energy in the range of 40 to 100 kilo electron volts, the thresh-hold implant can be provided by boron at a dose in the range $1 \times 10^{12}$ to $1 \times 10^{13}$ atoms/cm$^2$ and an energy in the range of 2 to 30 kilo electron volts. A channel implant can have a boron concentration on the order of $1 \times 10^{17}$ atoms/cm$^2$. Implants can also use arsenic; this can form an n-doped region. A heavy doped implant for instance is $3-5 \times 10^{15}$/cm$^2$ of arsenic at 50–80 keV.

FIG. 1a gives an overview of the self-aligned source, drain and gate salicide formation. This process starts with the surface of a semiconductor substrate 10', FIG. 1a. Forming insulation regions 12' that bound the active region isolates the active region that is to be used for the creation of, for instance, a gate electrode. Field Oxide (FOX) isolation regions 12' can be used to electrically isolate the discrete devices, such as Field Effect Transistors (FET's) in ULSI circuits on semiconductor chips formed from silicon substrate. One conventional approach in the semiconductor industry for forming field isolation is by the Local Oxidation of Silicon (LOCOS) method. LOCOS uses a patterned silicon nitride (Si$_3$N$_4$) as an oxidation barrier mask, the silicon substrate is selectively oxidized to form the semi-planar isolation. However, this method requires long oxidation times (thermal budget) and lateral oxidation under the barrier mask limits the minimum spacing between adjacent active device areas, and therefore prevents further increase in device packaging density.

One method of circumventing the LOCOS limitations and to further reduce the field oxide (FOX) minimum features size is to allow shallow trench isolation (STI). One method of making STI is to first etch trenches having essentially vertical sidewalls in the silicon substrate. The trenches are then filled with a CVD of silicon oxide (SiO$_2$) and the SiO$_2$ is then plasma etched back or polished back using CMP, to form the STI isolation region. These regions are indicated as regions 12' in FIG. 1a.

A thin layer 16' of gate oxide is thermally grown over the surface of the substrate 10' in the active device region. To create the gate structure, a layer 14' of polysilicon is grown over the thin layer 16' of gate oxide. The polysilicon layer 14' is masked and the exposed polysilicon and the thin layer of oxide are etched to create the polysilicon gate 14' that is separated from the substrate by the remaining thin layer of oxide 16'. The doping of the source/drain regions starts with creating the lightly N$^+$ doped diffusion (LDD) regions 32'/34'. The sidewall spacers 22' for the gate structure are formed after which the source and drain region doping is completed by doping the source/drain regions 18'/20' to the desired level of conductivity using a N$^+$ dopant.

Contact points to the source/drain regions and the electrode gate are then formed by first selectively depositing a layer of titanium over the surface of the source/drain regions and the top surface of the gate electrode. This titanium is annealed causing the deposited titanium to react with the underlying silicon of the source/gain regions and the doped surface of the gate electrode. This anneal forms layers of titanium silicide 24'/26' on the surfaces of the source/drain regions and layer 28' on the top surface of the gate electrode.

The metal contacts with the source/drain regions and the gate electrode are formed as a final step. A dielectric 30' such as silicon oxide is blanket deposited over the surface of the created structure, patterned and etched to create contact openings 36'/37' over the source/drain regions and opening 38' over the top surface of the gate electrode. The metalization layer selectively deposited over the patterned dielectric establishes the electrical contacts 40'/42' with the source/drain regions and 44' with the top surface of the gate electrode.

One of the key factors that affects the reliability of FET devices of small geometry results from the shrinkage of the channel length and channel width. To overcome problems associate with short and narrow channel effects is therefore an important concern in the design of FET devices. Gate oxide integrity can also be negatively affected by the hot-carrier effect. If the carriers can acquire sufficient energy from the lateral electric field (the field parallel to the plane of the substrate surface), these carriers may transfer across the substrate to the gate oxide interface thereby affecting the oxide conduction band and, ultimately, its function of forming a gate oxide layer of electrical separation. The electric field barrier for electron injection is smaller than it is for hole injection. This problem is therefore more prominent in n-channel MOSFET's because electrons form the charge carrier in the device channel.

For device features below the 0.5 $\mu$m range (deep submicron), thinner polysilicon is required for the gate electrode. A relatively thick layer of polysilicon when used for the electrode gate structure results in poly depletion and a larger effective time required for the oxidation process of the gate electrode, which results in lower drain saturation current and a higher threshold voltage for the gate electrode. By limiting the thickness of the layer of polysilicon, the energy that can be used to perform the pocket implants must be reduced, resulting in shallow implants.

Because of these processing issues, the application of the various implants requires considerable process development and in some instances new processes have to be used. Using conventional processing techniques to create deep and well-defined pocket implants, the implant energy and implant dosage cannot be increased. A high-energy pocket implant may result in penetration of the implant through the poly-silicon of the gate electrode thereby affecting the threshold voltage of the device. High dopant concentration will degrade the quality of the thin layer of gate oxide underlying the gate polysilicon.

For the creation of gate electrodes that have a channel length of 0.25 $\mu$m or less two aspects require special considerations. These two aspects are the reverse narrow width effect and the short channel effect. The issue of short channel effect has been discussed above. The invention addresses the reverse narrow width effect of creating sub-micron gate electrodes. This effect is increasingly important for the creation of for instance low power Static Random Access Memory (SRAM) devices since these devices are required to have good narrow channel width performance.

The reverse channel width effect is the occurrence of channel dopant diffusing from the channel region out to the STI oxide region causing rounding of the STI trench. The result is that the dopant concentration at the edges of the channel region that interfaces with the STI regions is reduced with respect to the center of the channel region of the gate electrode. A number of innovations have been provided, which are aimed at preventing this channel dopant out-diffusion, such as providing a silicon nitride liner in the STI trenches or providing a layer of nitride around the upper edge of the STI trenches. Another method has been provided whereby the loss of channel dopant is compensated by providing additional channel doping. However, increasing the dopant that is provided for the channel region most frequently results in increased out diffusion of the dopant to the surrounding STI regions while increased dopant concentration in the channel region further degrades the interface junction between the silicon substrate and the body of the gate electrode. The invention provides a method that compensates for the loss of dopant concentration around the perimeter of the channel region where this channel region interfaces with the surrounding STI region.

U.S. Pat. No. 6,121,096 (Hopper) shows an angle implant into a channel. However, this reference differs from the invention.

U.S. Pat. No. 5,240,874 (Roberts) and U.S. Pat. No. 6,083,795 (Liang et al.) show angle implant into corners to improve reverse narrow width effect.

SUMMARY OF THE INVENTION

A principle objective of the invention is to eliminate the negative impact on the channel region and the surrounding Shallow Trench Isolation regions of Field Effect Transistor (FET) devices that is incurred by out-diffusion of dopants from the channel region to surrounding Shallow Trench Isolation regions.

Another objective of the invention is to eliminate undesirable dopant distribution in the channel region of Field Effect Transistors caused by out-diffusion of dopant from the channel region of the Field Effect Transistors.

Yet another objective of the invention is to eliminate corner rounding or undesirable impurity concentrations in the Shallow Trench Isolation (STI) regions of Field Effect Transistors due to dopant concentrations in these STI regions incurred as a result of out-diffusion of dopant from the channel region.

In accordance with the objectives of the invention a new angle implant is provided that reduces or eliminates the effects of narrow channel impurity diffusion to surrounding regions of insulation. A layer of pad oxide is created over the surface of a silicon substrate, a layer of silicon nitride is deposited and patterned such that the layer of pad oxide is exposed where Shallow Trench Isolation regions are to be created. A layer of photoresist is deposited, patterned and etched to expose the surface of the p-well that has been created in the surface of the substrate, p-type impurity is then implanted into the corners of the STI region that are adjacent to NMOS device that is to be created over the p-well. The process is then repeated in reverse image order to perform a n-type implant into the corners of the STI region that are adjacent to the PMOS device that is to be created over a n-well region that has been created in the surface of the substrate. The p-type and n-type implants are angle implants that penetrate under the patterned layer of silicon nitride, thus penetrating into the corners of the STI regions underlying the patterned layers of silicon nitride. The substrate is, after the p-type and n-type angle implants, processed in the conventional manner to create STI trenches, fill the trenches with oxide and planarize the surface of the oxide that has been deposited inside the STI trenches. The formation of the N-well and the p-well use the same mask as the mask that is used for the angle implant.

BRIEF DESCRIPTION OF THE DRAWINGS

FIG. 1a shows a cross section of a prior art gate electrode and its supporting elements.

FIGS. 1b and 1c show cross sections for the identification of basic concepts that are germane to the invention.

FIGS. 2 through 8 highlight the invention, as follows:

FIG. 2 shows a cross section of a semiconductor substrate, a layer of pad oxide has been deposited over the surface of the substrate, a layer of silicon nitride has been deposited over the layer of pad oxide. The layer of silicon nitride has been patterned and etched leaving a pattern of silicon nitride in place over the surface regions of the substrate where CMOS devices must be created.

FIG. 3 shows a cross section after a first layer of photoresist has been deposited and patterned, exposing the surface of the patterned layer of silicon nitride over which NMOS devices are to be created. The p-well mask is used to pattern the first layer of photoresist, removing the photoresist from above the p-well of the substrate. The remaining layer of photoresist blocks the p-channel regions in the surface of the substrate.

FIG. 4 shows a cross section during implant of p-type impurity into the n-channel region.

FIG. 5 shows a cross section after the first patterned layer of photoresist has been removed from the p-channel region, a second layer of photoresist has been deposited and patterned whereby the second layer of photoresist blocks the n-channel region on the surface of the substrate. N-type impurities are implanted into the p-channel region.

FIG. 6 shows a cross section after the patterned second layer of photoresist has been removed, the layer of pad oxide and the surface of the substrate have been etched in accordance with the pattern of the layer of silicon nitride, creating trenches for the STI regions.

FIG. 7 shows a cross section after the deposition of a layer of dielectric, filling the trenches that have been created in the surface of the substrate.

FIG. 8 shows a cross section after the layer of silicon nitride has been removed and the layer of dielectric has been polished down to the surface of the layer of pad oxide.

DESCRIPTION OF THE PREFERRED EMBODIMENTS

Figure 4:
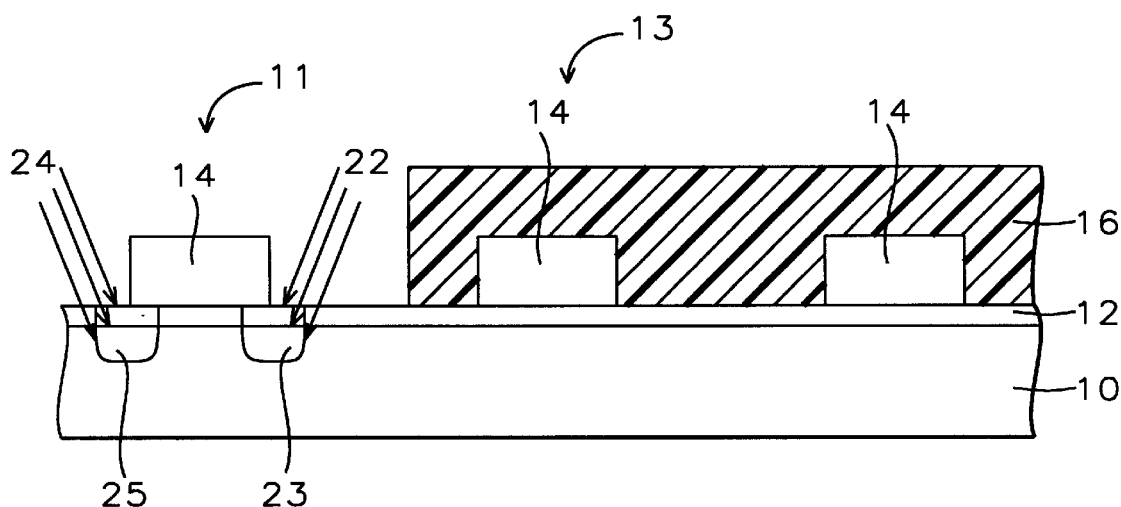

FIGS. 1b and 1c are used to further highlight basic regions that are created as part to the creation of CMOS devices. These basis regions are of interest to the description of the invention that is provided in the balance of this specification.

Highlighted in FIG. 1b are the following elements:

10, the semiconductor substrate on the surface of which CMOS devices are to be created 11, a cross section of a NMOS devices that is created on the surface of substrate 10

13, a cross section of a PMOS devices that is created on the surface of substrate 10

17, STI regions that are created between the CMOS devices that are created on the surface of substrate 10

41, an n-channel region underlying NMOS device 11

43, an p-channel region underlying PMOS device 13

15, a p-well underlying the NMOS device 11

45, an p-well mask of photoresist that is used for the creation of p-well 15

47, channel dopant that, for devices with sub-micron channel length, diffuses from the channel regions 41 and 43 to the adjacent STI regions 17.

The cross section that is shown in FIG. 1c essentially shows the same elements as have been highlighted for FIG. 1b. Deleted from FIG. 1b are the p-well mask 45 and the p-well 15, these two items are replaced in FIG. 1c with the n-well mask 45' of photoresist and the n-well 49 that has been created in the surface of substrate 10. All other elements that are shown in FIG. 1c remain the same as the elements that have been shown in FIG. 1b.

It is of value to highlight the basic ground rules or concepts that are used by the invention, as follows:

the p-well mask is used to block the p-channel regions, during this blocking of the p-channel regions a p-type dopant is implanted into the n-channel, this relates to the cross section that is shown in FIG. 1b, and the n-well mask is used to block the n-channel regions, during this blocking of the n-channel regions a n-type dopant is implanted into the p-channel, this relates to the cross section that is shown in FIG. 1c.

The method of creating impurity concentrations that prevent the reverse narrow width effect is now described in detail. These impurity concentrations are created for CMOS devices with a channel length of 0.25 μm or less.

Referring now to FIG. 2, a substrate 10, composed of a single crystalline silicon, with a <100> orientation, is used. A layer 12 of pad oxide is created over the surface of substrate 10. Typically, a blanket pad oxide can be formed to a thickness of about 150 Angstrom through a thermal oxidation method at a temperature of about 900 degrees C. for a time period of about 10 to 20 minutes. A layer 14 of silicon nitride has been deposited over the surface of the layer 12 of pad oxide. The layer 14 of silicon nitride ($Si_3N_4$) can be deposited using LPCVD or PECVD procedures at a pressure between about 300 mTorr and 400 mTorr, at a temperature between about 600 and 800 degrees C., to a thickness of about 2500 Angstrom using $NH_3$ and $SiH_4$. The silicon nitride layer 14 can also be deposited using LPCVD or PECVD procedures using a reactant gas mixture such as dichlorosilane ($SiCl_2H_2$) and amonia ($NH_3$). Photolithographic techniques and Reactive Ion Etching (RIE) are then used to create the desired pattern in the layer 16 of silicon nitride.

The silicon nitride layer 14 can be wet etched using a phosphoric acid solution. The silicon nitride can also be etched using anisotropic RIE using $CHF_3$ or $SF_6$—$O_2$ as an etchant. The silicon nitride layer 14 can also be dipped into phosphoric acid ($H_3PO_4$) to be removed.

The pattern of silicon nitride that has been highlighted with 14 in FIG. 2 aligns with surface areas of substrate 10 over which CMOS devices are to be created. Another way of stating this is to say that the surface regions of substrate 10 that are exposed in FIG. 2 and that are located between the pattern 14 of silicon nitride are the surface regions into which the STI trenches are to be etched.

FIG. 3 shows a cross section of the silicon substrate after a layer 16 of photoresist has been deposited over the surface of the substrate. Layer 16 has been patterned and etched, using the p-well mask in order to leave the layer of photoresist in place overlying the p-channel regions in the surface of substrate 10. From this it follows that region highlighted as 13 in FIG. 3 is the p-channel region of the substrate, that is the regions over which PMOS devices are to be created. From this further follows that the region highlighted as region 11 is the n-channel region of the substrate, that is the regions over which NMOS devices are to be created.

The deposition and patterning of the layer 16 of photoresist uses conventional methods of deposition and photolithography that are well known in the art. Photoresist stripping frequently uses sulfuric acid ($H_2SO_4$) and mixtures of $H_2SO_4$ with other oxidizing agents such as hydrogen peroxide ($H_2O_2$), the same components are frequently used in cleaning a wafer surface after the photoresist has been stripped. It must thereby be remembered that the mask that is used for the patterning of layer 16 of photoresist is the n-well mask resulting in blocking (shielding) the p-channel region.

FIG. 4 shows a cross section during the process of performing an angle implant into the surface of the substrate, two different implants 22 and 24 are shown. Implant 22 creates p-type impurity concentration 23, implant 24 forms a second p-type impurity concentration 25. Implants 22 and 24 implant p-type dopants into regions 23 and 25. The conventional well implant, punchthrough implant and Vt implant are all made in a vertical direction to the surface of substrate 10, using the same mask. These latter implants are not part of the invention and will therefore not be further discussed.

It must be emphasized that implants 22 and 24 are controlled such that these implants are shallow implants, this to assure that the implants do not have an effect, other than compensating for the reverse narrow width effect, on the p-well impurity concentration. Implants 22 and 24 can be performed by rotating the wafer to the surface of which these implants are performed so that the implant angle remains the same, all implants 22 are first performed after which wafer rotation allows implants 24.

The angled implants 22 and 24 use boron or indium ions as a source, at an energy in the range of between about 150 KeV and 200 KeV and a dose in the range between about 5E12 and 5E13 atoms/cm$^2$.

Figure 5:
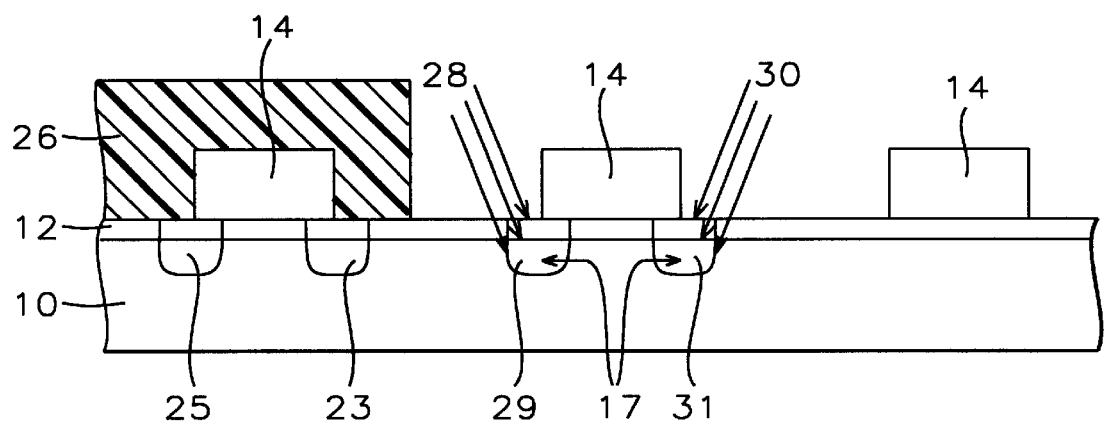

FIG. 5 shows a cross section after the patterned layer 16 (FIG. 4) of photoresist has been removed from the surface of the substrate. A second layer 26 of photoresist has been deposited and patterned, this time using the n-well mask for the patterning of layer 26 in order to shield the n-channel region 11. Implants 28 and 30 are n-type impurity implants that create impurity concentrations 29 and 31. The angled implants 28 and 30 use arsenic or phosphorous ions as a source, at an energy in the range of between about 150 KeV and 200 KeV and a dose in the range between about 5E12 and 5E13 atoms/cm$^2$.

Figure 6:
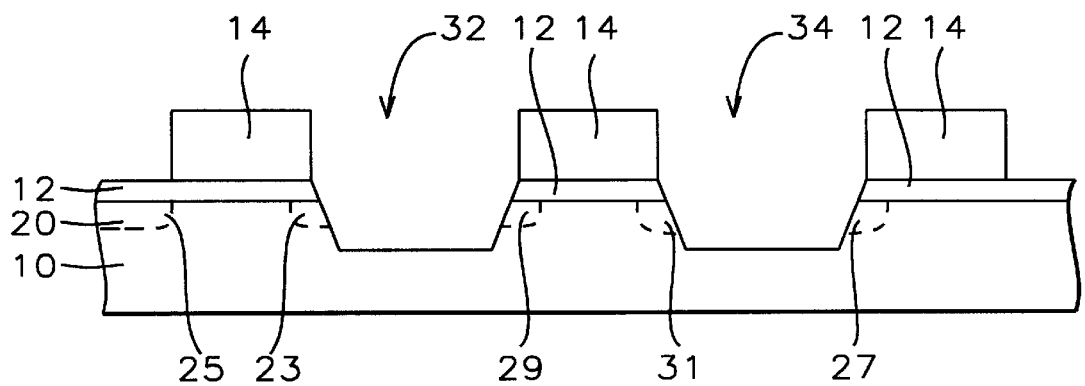

FIG. 6 shows a cross section wherein the patterned layer 26 (FIG. 5) of photoresist has been removed from the surface of the substrate, trenches 32 and 34 have etched through the layer 12 of pad oxide and into the surface of the substrate 10, implant 27 is an impurity implant adjacent to trench 34 which has been shown in order to be complete.

Methods of photoresist removal have previously been highlighted and need therefore not be further addressed at this point.

Layer 12 of pad oxide can be etched using for instance reactive ion etching using Ar/$CF_4$ as an etchant at a temperature of between about 120 and 160 degrees C. and a pressure of between about 0.30 and 0.40 Torr for a time of between about 33 and 39 seconds using a dry etch process.

Figure 7:
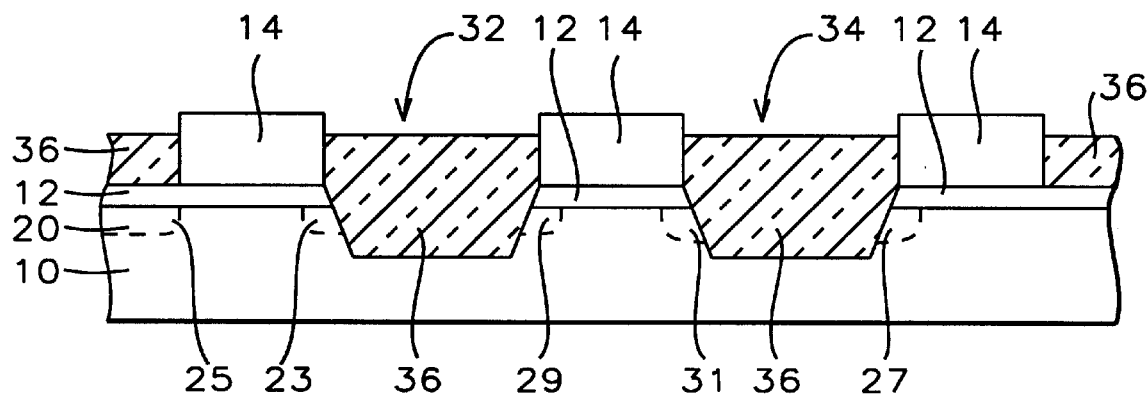
Figure 8:
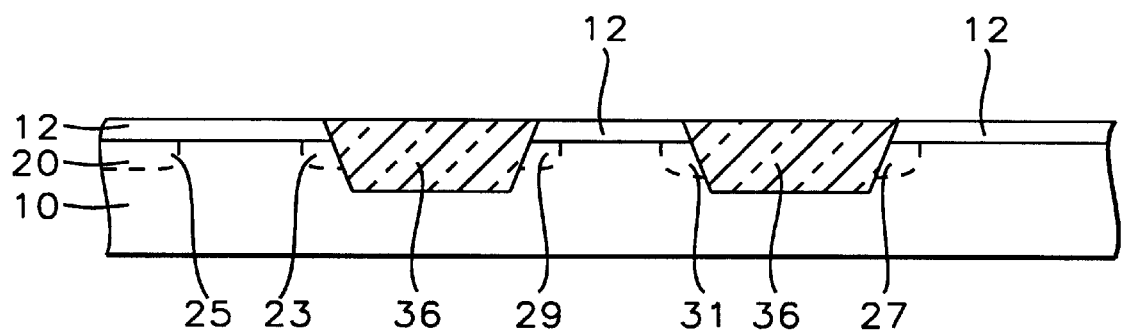

FIG. 7 shows a cross section after trenches 32 and 34 have been filled with a chemical vapor deposition (CVD) of silicon oxide (SiO$_2$) layer 36. For a final step of the creation of the STI regions, FIG. 7, layer 14 of silicon nitride and the layer of SiO$_2$ are then etched back or mechanically or chemically polished to yield a planar surface. The final cross section of the invention is shown in FIG. 8, after the layer 14 of silicon nitride has been removed and the layer 36 of dielectric has been polished down to the surface of the layer of pad oxide using methods of Chemical Mechanical Polishing.

To summarize the invention and the results that are achieved with the invention:

the p-well mask is used to pattern a first layer of photoresist, the remaining layer of photoresist blocks the p-channel regions. The photoresist that is removed exposes the surface of the p-well region of the substrate and therewith exposes the regions of the substrate over which NMOS devices are to be created. The surface of the regions of the substrate into which STI regions are to be etched is also exposed, angle implants 22 and 24 are performed, and the n-well mask is used to pattern a second layer of photoresist, the remaining layer of photoresist blocks the n-channel regions. The photoresist that is removed exposes the surface of the n-well region of the substrate and therewith exposes the regions of the substrate over which PMOS devices are to be created. The surface of the regions of the substrate into which STI regions are to be etched is also exposed. A n-type dopant is implanted into the surface of the substrate that is adjacent to the n-channel, thus compensating for any p-type impurity flow from the p-type channel into the STI regions that are adjacent to the p-channel.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method to reduce reverse narrow width effect in CMOS devices, comprising the steps of:

providing a substrate, said substrate having been provided with a layer of pad oxide over the surface of the substrate;

creating a pattern of ion implant barrier material over the surface of said layer of pad oxide, said pattern of ion implant material comprising a first pattern being aligned with a pattern of NMOS devices being created over the surface of said substrate and a second pattern being aligned with a pattern of PMOS devices being created over the surface of said substrate;

creating an p-well mask over the surface of said substrate, exposing said first pattern of implant barrier material;

performing a first angle implant into the surface of said substrate;

removing said p-well mask from the surface of said substrate;

creating an n-well mask over the surface of said substrate, exposing said second pattern of implant barrier material;

performing a second angle implant into the surface of said substrate;

removing said n-well mask from the surface of said substrate;

creating a pattern of Shallow Trench Isolation (STI) regions into the surface of said substrate, said pattern of STI regions being interspersed with said pattern of ion implant barrier material;

removing said pattern of ion implant barrier material from over the surface of said substrate, thereby reducing a height of said created STI regions down to the surface of said layer of pad oxide; and completing processing of said CMOS devices.

2. The method of claim 1 wherein said first angle implant comprises a p-type impurity implant using boron or indium ions as a source, at an energy in the range of between about 150 KeV and 200 KeV and a dose in the range between about 5E12 and 5E13 atoms/cm$^2$.

3. The method of claim 1 wherein said first angle implant is performed under an angle with the surface of said substrate between about 30 and 60 degrees.

4. The method of claim 1 wherein said second angle implant comprises a n-type impurity implant using arsenic or phosphorous ions as a source, at an energy in the range of between about 150 KeV and 200 KeV and a dose in the range between about 5E12 and 5E13 atoms/cm$^2$.

5. The method of claim 1 wherein said second angle implant is performed under an angle with the surface of said substrate between about 30 and 60 degrees.

6. The method of claim 1 wherein said ion implant barrier material comprises silicon nitride.

7. The method of claim 1, further completing creation of at least one NMOS and at least one CMOS device, said at least one NMOS devices being created overlying surface areas of said substrate into which said first angle implant has been performed, said at least one PMOS devices being created overlying surface areas of said substrate into which said second angle implant has been performed.

8. The method of claim 1, said substrate comprising at least one p-well, said first pattern of ion implant barrier material being aligned with said at least one p-well.

9. The method of claim 1, said substrate comprising at least one n-well, said second pattern of ion implant barrier material being aligned with said at least one n-well.

10. A method for the creation of semiconductor surface regions over the surface of which CMOS devices are created, comprising the steps of:

providing a semiconductor substrate;

providing a pattern of ion implant barrier material over the surface of said substrate shielding surface areas in said semiconductor substrate over which CMOS devices are to be created against ion implantation;

implanting surface regions in the surface of the substrate over which NMOS devices are to be created with a first angle implantation;

implanting surface regions in the surface of the substrate over which PMOS devices are to be created with a second angle implant;

etching the surface of said semiconductor substrate in regions between said surface regions of the substrate over which NMOS and said PMOS devices are to be created, created openings in said substrate; and filling said openings created in said substrate with a dielectric, planarizing the surface of said dielectric, removing said pattern of ion implant barrier material from the surface of said substrate.

11. The method of claim 10 with the additional step of creating a layer of pad oxide over the surface of the substrate, said step to be performed prior to said step of providing a pattern of ion implant barrier material over the surface of said substrate.

12. The method of claim 10, said providing a pattern of ion implant barrier material over the surface of said substrate comprising the steps of:

depositing the layer of ion implant barrier material over the surface of the substrate; and patterning and etching said layer of implant barrier material, creating a pattern of implant barrier material overlying surface regions of said substrate over which NMOS devices are to be created, further creating a pattern of implant barrier material overlying surface regions of said substrate over which PMOS devices are to be created, partially exposing the surface of said substrate.

13. The method of claim 10, implanting surface regions in the surface of the substrate over which NMOS devices are to be created with a first angle implant comprising the steps of:

depositing a first layer of photoresist over said substrate;

patterning and etching said first layer of photoresist, using an p-well mask for exposure of said layer of photoresist, removing said layer of photoresist from above p-well regions in the surface of said substrate;

performing a first angle implant into the surface of said substrate self-aligned with said pattern of ion implant barrier material overlying regions in the surface of said substrate over which NMOS devices are to be create; and removing said first patterned layer of photoresist from the surface of said substrate.

14. The method of claim 10, said first angle implantation using boron or indium ions as a source, at an energy in the range of between about 150 KeV and 200 KeV and a dose in the range between about 5E12 and 5E13 atoms/cm$^2$.

15. The method of claim 10, said first angle implantation being performed under an angle with the surface of said substrate between about 30 and 60 degrees.

16. The method of claim 10, said implanting surface regions in the surface of the substrate over which PMOS devices are to be created with a second angle implant comprising the steps of:

depositing a second layer of photoresist over the exposed surface of said substrate;

patterning and etching said second layer of photoresist, using an n-well mask for exposure of said layer of photoresist, removing said layer of photoresist from above n-well regions in the surface of said substrate;

performing a second angle implant into the surface of said substrate self-aligned with said pattern of ion implant barrier material overlying regions in the surface of said substrate over which PMOS devices are to be created into the surface of the substrate; and removing said second patterned layer of photoresist from the surface of said substrate.

17. The method of claim 10, said second angle implantation using arsenic or phosphorous ions as a source, at an energy in the range of between about 150 KeV and 200 KeV and a dose in the range between about 5E12 and 5E13 atoms/cm$^2$.

18. The method of claim 10, said second angle implantation being performed under an angle with the surface of said substrate between about 30 and 60 degrees.

19. The method of claim 10, said ion implant barrier material comprising silicone nitride.

20. The method of claim 10, wherein filling said openings created in said substract with a dielectric is depositing a layer of silicone dioxide.

21. The method of claim 10, further completing creation of said CMOS devices by creating at least one NMOS device and at least one CMOS device, said at least one NMOS device being created overlying surface areas of said substrate into which first angle implants have been performed, said at least one PMOS device being created overlying surface areas of said substrate into which second angle implant have been performed.

* * * * *